(12) United States Patent
Yamada

(10) Patent No.: US 8,692,632 B2
(45) Date of Patent: Apr. 8, 2014

(54) RESONATOR ELEMENT, RESONATOR, OSCILLATOR, AND ELECTRONIC DEVICE

(75) Inventor: Akinori Yamada, Ina (JP)

(73) Assignee: Seiko Epson Corporation (JP)

( * ) Notice: Subject to any disclaimer, the term of this patent is extended or adjusted under 35 U.S.C. 154(b) by 343 days.

(21) Appl. No.: 13/040,625

(22) Filed: Mar. 4, 2011

(65) Prior Publication Data

US 2011/0227672 A1 Sep. 22, 2011

(30) Foreign Application Priority Data

Mar. 17, 2010 (JP) ................................. 2010-060325
Dec. 17, 2010 (JP) ................................. 2010-281336

(51) Int. Cl.
*H03H 9/21* (2006.01)
*H03B 5/32* (2006.01)

(52) U.S. Cl.
USPC .... 333/200; 310/370; 331/116 R; 331/107 A; 331/156

(58) Field of Classification Search
USPC ........... 333/200; 310/370; 331/116 R, 107 A, 331/156
See application file for complete search history.

(56) References Cited

U.S. PATENT DOCUMENTS

| | | | |
|---|---|---|---|
| 6,587,009 B2 | 7/2003 | Kitamura et al. | 331/158 |
| 7,015,631 B2 * | 3/2006 | Hirasawa et al. | 310/370 |
| 7,138,752 B1 * | 11/2006 | Dalla Piazza et al. | 310/370 |
| 7,205,708 B2 * | 4/2007 | Yamada | 310/370 |
| 7,906,890 B2 * | 3/2011 | Kawanishi et al. | 310/370 |
| 2009/0021120 A1 | 1/2009 | Dalla Piazza et al. | 310/370 |
| 2009/0289530 A1 * | 11/2009 | Kawanishi | 310/370 |
| 2010/0096953 A1 * | 4/2010 | Iwai | 310/370 |
| 2010/0117492 A1 * | 5/2010 | Kawashima | 310/353 |
| 2010/0156237 A1 * | 6/2010 | Ichikawa et al. | 310/312 |

FOREIGN PATENT DOCUMENTS

| | | |
|---|---|---|
| JP | 01-236808 | 9/1989 |
| JP | 02-032229 | 2/1990 |
| JP | 2002-141770 A | 5/2002 |
| JP | 2002-261575 | 9/2002 |
| JP | 2004-260718 | 9/2004 |

(Continued)

OTHER PUBLICATIONS

C. Zener et al., "Internal Friction in Solids I. Theory of Internal Friction in Reeds", Physical Review, vol. 52, pp. 230-235 (Aug. 1, 1937).

(Continued)

*Primary Examiner* — Barbara Summons
(74) *Attorney, Agent, or Firm* — Harness, Dickey & Pierce, P.L.C.

(57) ABSTRACT

A resonator element includes a base portion in which a pair of notches is formed, a pair of resonating arms which is extended in parallel from one end side of a first portion of the base portion. The resonating arm is provided with a bottomed elongated groove which has an opening along at least one principal surface of both principal surfaces and a weight portion which is formed at the tip end side of the resonating arm on the opposite side of a root of the resonating arm attached to the base portion and which has a larger width than on the root side. The weight portion is formed so that the proportion of the length of the weight portion to the length from the root to the tip end side in a longitudinal direction of the resonating arm is within a range of 35% to 41%.

12 Claims, 7 Drawing Sheets

(56) References Cited

FOREIGN PATENT DOCUMENTS

| | | | |
|---|---|---|---|
| JP | 2004-282230 | | 10/2004 |
| JP | 2005-005896 | | 1/2005 |
| JP | 2005-150992 | * | 6/2005 |
| JP | 2009-027711 | | 2/2009 |
| JP | 2010-157933 | | 7/2010 |
| WO | WO-00-44092 A1 | | 7/2000 |

OTHER PUBLICATIONS

C. Zener et al., "Internal Friction in Solids II. General Theory of Thermoelastic Internal Friction", Physical Review, vol. 53, pp. 90-99 (Jan. 1, 1938).

C. Zener et al., "Internal Friction in Solids III. Experimental Demonstration of Thermoelastic Internal Friction", Physical Review, vol. 53, pp. 100-101 (Jan. 1, 1938).

Hideaki Itoh et al., "Analysis of Q-Value of Quartz Crystal Tuning Fork Using Thermoelastic Coupling Equations" Japanese Journal of Applied Physics 48, pp. 07GF03-1 to 07GF03-5 (Jul. 21, 2009).

Hideaki Itoh et al., "Analysis of Q-Value of a Quartz-Crystal Tuning-Fork Using Thermoelastic Equations" 36th EM Symposium, pp. 5-8 (May 17, 2007).

Terry V. Roszhart, "The Effect of Thermoelastic Internal Friction on the Q of Micromachined Silicon Resonators", Solid-State Sensor and Actuator Workshop, 1990 4th Technical Digest IEEE, pp. 13-16 (Jan. 4, 1990).

* cited by examiner

RESONATOR ELEMENT, RESONATOR, OSCILLATOR, AND ELECTRONIC DEVICE

BACKGROUND

1. Technical Field

The present invention relates to a resonator element such as a flexural resonator element that vibrates, for example, in a flexural vibration mode, a resonator or an oscillator that uses the resonator element, and an electronic device having the oscillator.

2. Related Art

In the related art, a tuning-fork type flexural resonator element in which a pair of resonating arms is extended from a base portion made from a piezoelectric material such as a quartz crystal so as to vibrate in the direction towards or away from each other in the horizontal direction is widely used as a resonator element that vibrates in the flexural vibration mode. When the resonating arms of the tuning-fork type flexural resonator element are excited, if there is a loss of the vibration energy thereof, it decreases the performance of the resonator element by, for example, an increase of the CI (Crystal Impedance) value or a decrease of the Q value. Thus, various attempts have been made to prevent or suppress such a loss of vibration energy.

For example, a tuning-fork type quartz crystal resonator element in which a cutout portion or a notch (notched groove) with a predetermined depth is formed on both sides of the base portion from which the resonating arms extend is known (for example, see JP-A-2002-261575 and JP-A-2004-260718). In this tuning-fork type quartz crystal resonator element, when the vibration of the resonating arms includes a vertical component, the loss of vibration from the base portion is suppressed by the notch. Thus, a confinement effect of the vibration energy increases, and the Q value is controlled and the fluctuation of the Q value between the resonator elements is prevented.

Moreover, in a resonator element, the decrease of the Q value occurs not only due to the mechanical loss of vibration energy described above, but also occurs due to thermal conduction caused by a temperature difference between a contracted portion where compressive stress of the resonating arms performing flexural vibration acts and an expanded portion where tensile stress acts. The decrease of the Q value caused by thermal conduction is referred to as a thermoelastic loss effect.

A tuning-fork type resonator element in which a groove or a hole is formed on the central line of a resonating arm (vibrating beam) having a rectangular section in order to prevent or suppress the decrease of the Q value due to the thermoelastic loss effect is disclosed in JP-UM-A-2-32229, for example.

In recent years, various electronic devices having the resonator element have been miniaturized. Examples of such electronic devices include miniaturized information devices such as HDDs (Hard Disk Drives), mobile computers, or IC cards, mobile communication devices such as portable phones, car phones, or paging systems, and vibration gyro sensors. In line with this, there is a higher level of demand for miniaturization of resonator elements mounted in these electronic devices.

Among the demand for miniaturization of such a resonator element, shortening of the length of a resonating arm is particularly promising. In line with this, there is a demand to decrease the cross-sectional area of the resonating arm. Therefore, it has been understood that it is difficult to decrease the frequency of the resonator element and the vibration characteristics of the resonator element are likely to become unstable due to the occurrence of a high-order vibration mode. As a resonator element capable of suppressing the occurrence of such a high-order vibration mode, decreasing the frequency, and stabilizing the vibration characteristics, a resonator element in which a weight portion having a larger width than a general portion (arm portion) of a resonating arm is formed at the tip end of the resonating arm is disclosed in JP-UM-A-2005-5896, for example.

However, the present inventor has found that when the resonator element has a structure in which it has a resonating arm which includes both an elongated groove and a weight portion, if the occupancy of the length of the weight portion with respect to the entire length in the longitudinal direction of the resonating arm is too small or too large, it is not possible to obtain a desirable effect of decreasing the frequency with the weight portion and a desirable effect of suppressing thermoelastic loss with the elongated groove. Moreover, the present inventor has also found that when the occupancy of the length of the weight portion with respect to the entire length in the longitudinal direction of the resonating arm is within a certain range, it is possible to obtain the desired Q value by effect of decreasing the frequency with the weight portion and the desirable effect of suppressing thermoelastic loss with the elongated groove.

SUMMARY

An advantage of some aspects of the invention is to solve at least a part of the problems described above and the invention can be implemented as the following forms or application examples.

Application Example 1

This application example of the invention is directed to a resonator element including a base portion; and a resonating arm which is extended from the base portion, in which the resonating arm is provided with a bottomed elongated groove which has an opening along at least one principal surface of both principal surfaces of the resonating arm, the resonating arm is provided with a weight portion which is formed at a tip end side of the resonating arm on the opposite side of a root of the resonating arm attached to the base portion and which has a larger width than the width of the resonating arm on the root side attached to the base portion, and the proportion of the length of the weight portion to the length from the root attached to the base portion to a tip end of the resonating arm in a longitudinal direction of the resonating arm is within a range of 35% to 41%.

According to this configuration, the present inventor has found that in the resonator element, the elongated groove provided in the resonating arm improves the vibration efficiency and decreases the CI value, and the weight portion at the tip end of the resonating arm performs the function of a weight. Thus, it is possible to obtain an effect of suppressing the frequency to a sufficiently low value without increasing the length of the resonating arm. In addition, the thermoelastic loss decreases and the effect of sufficiently suppressing the decrease of the Q value is obtained. Therefore, it is possible to provide a resonator element in which miniaturization is realized and a decrease of the Q value is suppressed, and which has a low frequency and favorable vibration characteristics.

Application Example 2

This application example of the invention is directed to the resonator element, wherein the proportion of the length of the weight portion is within a range of 36% to 40%.

According to this configuration, it is possible to obtain a noticeable effect of decreasing the size and the frequency and suppressing the decrease of the Q value.

Application Example 3

This application example of the invention is directed to the resonator element, wherein the proportion of the length of the weight portion is within a range of 37% to 39%.

According to this configuration, it is possible to obtain a more noticeable effect of decreasing the size and the frequency and suppressing the decrease of the Q value.

Application Example 4

This application example of the invention is directed to the resonator element, wherein the resonator element further includes two resonating arms which are extended from the base portion; and a supporting arm which is formed so as to extend from a portion of the base portion between the two resonating arms in the longitudinal direction of the resonating arm.

According to this configuration, in the resonator element, since the supporting arm is provided between a pair of resonating arms, it is possible to suppress changes in operation parameters of the resonator element which may occur due to the disturbance of the air between the respective resonating arms when the respective resonating arms vibrate, particularly when the respective resonating arms vibrate in the direction toward each other.

Moreover, it is possible to prevent various problems which may occur when the base portion is supported and fixed to a package or the like as a supporting portion, such as a problem wherein the tip end of the resonator element comes into contact with the package or the like in a state of being tilted downward. Furthermore, it is possible to suppress the occurrence of operational abnormalities which may occur when an impact on the package is directly transmitted to the resonating arm through the base portion. Thus, it is possible to provide a resonator element having stable vibration characteristics.

Application Example 5

This application example of the invention is directed to the resonator element, wherein the base portion and the resonating arm are formed from a quartz crystal.

According to this configuration, it is possible to provide a quartz crystal resonator element which has high impact resistance and favorable vibration characteristics and in which a decrease of the Q value resulting from a thermoelastic loss is suppressed.

Application Example 6

This application example of the invention is directed to the resonator element, wherein the resonator element is a flexural resonator element which has a flexural vibration mode.

According to this configuration, the present inventor has found that in a flexural resonator element which has a flexural vibration mode, it is possible to obtain a more noticeable effect of decreasing the frequency and suppressing the decrease of the Q value.

Application Example 7

This application example of the invention is directed to a resonator including the resonator element and a package that accommodates the resonator element.

According to this configuration, since the resonator includes the resonator element of the above aspect, it is possible to provide a small-sized resonator in which the vibration efficiency is improved by the elongated groove to decrease the CI value, and the frequency is decreased by the weight portion, and the decrease of the Q value resulting from a thermoelastic loss is suppressed, and which has favorable vibration characteristics.

Application Example 8

This application example of the invention is directed to an oscillator including the resonator element according to the above aspect; a circuit portion that is electrically connected to the resonator element; and a package that accommodates the resonator element and the circuit portion.

According to this configuration, since the oscillator includes the resonator element of the above aspect, it is possible to provide an oscillator in which the vibration efficiency is improved by the elongated groove to decrease the CI value, and the frequency is decreased by the weight portion and the decrease of the Q value resulting from thermoelastic loss is suppressed, and which has favorable vibration characteristics.

Application Example 9

This application example of the invention is directed to an electronic device including the oscillator according to the above aspect.

According to this configuration, since the electronic device includes the oscillator of the above aspect, the electronic device can achieve a further miniaturization and improvement in reliability.

BRIEF DESCRIPTION OF THE DRAWINGS

The invention will be described with reference to the accompanying drawings, wherein like numbers reference like elements.

DESCRIPTION OF EXEMPLARY
EMBODIMENTS

Hereinafter, exemplary embodiments of a resonator element of the invention, a resonator or an oscillator using the resonator element, and an electronic device having the oscillator will be described with reference to the drawings.

Embodiment

Vibrating Reed

First, prior to description of an electronic device of the invention, a resonator element provided in the electronic device will be described.

Figure 1A:
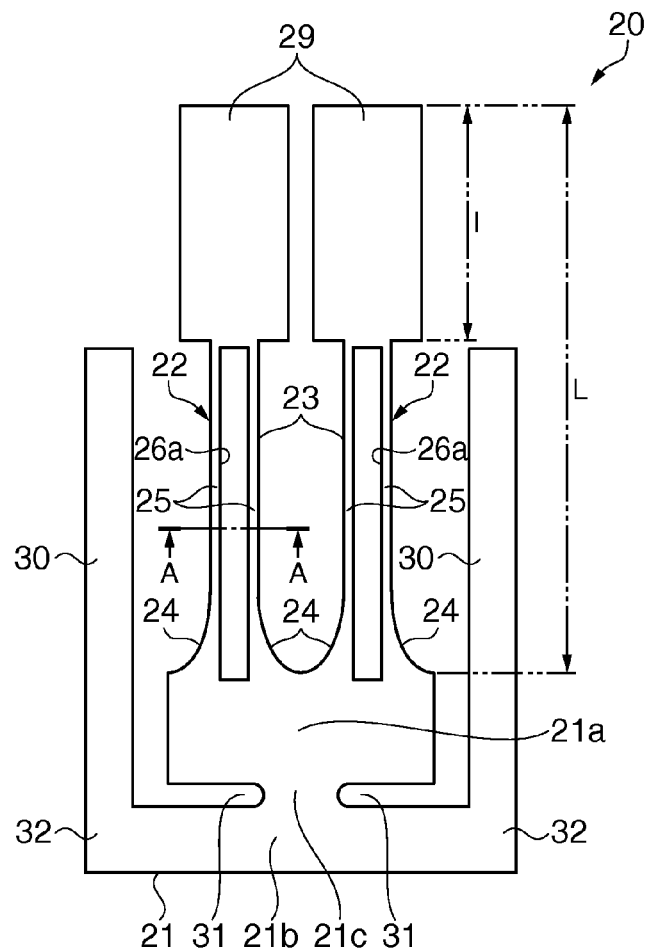
FIG. 1A is a top view on one principal surface side, schematically illustrating an embodiment of a resonator element provided in an electronic device according to the invention.
Figure 1B:
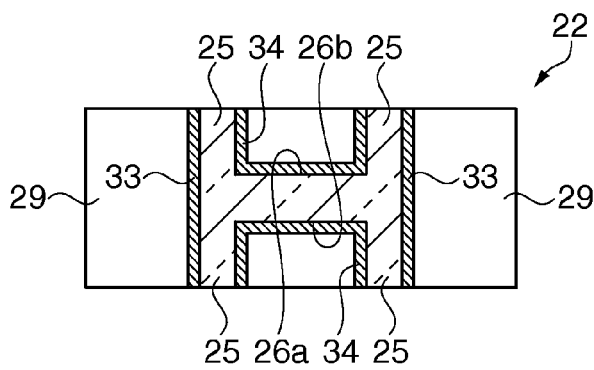
FIG. 1B is a cross-sectional enlarged view of a cross section taken along the line A-A in FIG. 1A.

FIGS. 1A and 1B schematically illustrate a resonator element according to this embodiment, in which FIG. 1A is a top view on one principal surface, and FIG. 1B is a cross-sectional enlarged view of a cross section taken along the line A-A in FIG. 1A.

As shown in FIG. 1A, a resonator element 20 of this embodiment is a resonator element which has a flexural vibration mode and which is formed from a piezoelectric material such as a quartz crystal, lithium tantalate, or lithium niobate. When the resonator element 20 is formed from a quartz crystal, a quartz crystal wafer obtained by dicing and polishing a quartz crystal Z plate to a predetermined thickness is used. The quartz crystal Z plate is cut while being rotated within the angle range of 0° to 5° in the clockwise direction about the Z axis of an orthogonal coordinate system made up of X, Y, and Z axes. The resonator element 20 of this embodiment is a quartz crystal resonator element which is formed so as to have a so-called tuning-fork type outer shape and which includes a base portion 21 formed by processing the quartz crystal Z plate and a pair of resonating arms 22 extending in parallel by being divided into two stages from one end side (the upper end side in the drawing) of the base portion 21.

In the base portion 21, a pair of notches 31 is formed so as to extend in opposite directions along one straight line so that it has a shape that is bound to both principal surfaces of the base portion 21. The base portion 21 includes first and second portions 21a and 21b which are positioned on both sides of the base portion 21 with the pair of notches 31 disposed therebetween and a connecting portion 21c which connects the first and second portions 21a and 21b between the pair of notches 31. In the resonator element 20 of this embodiment, since the notches 31 block the transfer of vibration of the respective resonating arms 22, it is possible to suppress a so-called vibration leakage which is a phenomenon where a vibration is transferred to the outside through the base portion 21 and a supporting arm 30, and to prevent an increase of the CI value.

It is desirable that the shape of the respective notches 31 is adjusted to an optimum width and length so as to ensure the strength of the resonator element 20 against dropping and minimize the vibration leakage.

As shown in FIG. 1A, the pair of resonating arms 22 extend from the first portion 21a of the base portion 21 in a direction parallel to both principal surfaces (the front and rear surfaces of the drawing sheet). Moreover, each resonating arm 22 has the two principal surfaces and two side surfaces that connect the two principal surfaces on both sides.

Each resonating arm 22 has a general portion 23 which is disposed at the central portion thereof and which is a major vibrating portion of the resonating arm 22. Moreover, each resonating arm 22 has a large width portion 24 which is disposed in a root portion connected to the base portion 21 and of which the width between the two side surfaces gradually increases from the general portion 23 towards the base portion 21 and reaches the maximum at a root portion attached to the base portion 21. As described above, since each resonating arm 22 has the large width portion 24, the resonating arm 22 is connected to the base portion 21 with the large width. Thus, the rigidity increases and the impact resistance or the like improves.

A weight portion 29 having a larger width than the general portion 23 is formed at a tip end side of each resonating arm 22 on the opposite side of the root attached to the base portion 21. Since the weight portion 29 is formed at the tip end of each resonating arm 22, the tip end performs the function of a weight. Thus, it is possible to decrease the frequency without increasing the length of the resonating arm 22.

In the longitudinal direction (in this example, the extension direction of each resonating arm 22 from the first portion 21a of the base portion 21) of each resonating arm 22 of the resonator element 20, the proportion of the length l of the weight portion 29 to the length L from the root attached to the base portion 21 to the tip end is adjusted so as to be within the range of 35% to 41%. The present inventor has found that when the resonator element 20 is configured in such a way, since the weight portion 29 which is the tip end of each resonating arm 22 performs the function of a weight, it is possible to obtain an effect of suppressing the frequency to a sufficiently low value without increasing the length of the resonating arm 22. Moreover, it is possible to obtain an effect of decreasing thermoelastic loss and sufficiently suppressing the decrease of the Q value (details of which will be described later).

On one principal surface of each resonating arm 22, one bottomed elongated groove 26a is provided along the longitudinal direction thereof. Moreover, as shown in FIG. 1B, on the other principal surface of one resonating arm 22 (the left one on the drawing sheet of FIG. 1A), one elongated groove 26b is provided along the longitudinal direction of the resonating arm 22. Similarly, although not shown in the drawing, on the other principal surface of the other resonating arm 22 (the right one on the drawing sheet), one bottomed groove 26b is provided. That is, the elongated grooves 26a and 26b have an opening which is positioned along the principal surface.

As described above, with the elongated grooves 26a and 26b provided on each resonating arm 22, the rigidity decreases and the resonating arm 22 can easily vibrate. Thus, the resonating arm 22 is able to vibrate efficiently and exhibit favorable vibration characteristics. Moreover, the elongated grooves 26a and 26b narrow the flow path of heat resulting from changes in the temperature occurring in projecting portions 25 on both side surfaces of the resonating arm 22 due to deformation associated with vibrations near the root portion of each resonating arm 22 attached to the base portion 21. Thus, it is possible to obtain an effect of suppressing conduction of heat and decreasing a thermoelastic loss. As a result, it is possible to suppress an adverse effect resulting from the thermoelastic loss such as, for example, an increase of the CI value or a decrease of the Q value.

The resonator element 20 of this embodiment has a pair of supporting arms 30 extending from the second portion 21b of the base portion 21. The pair of supporting arms 30 extends in a mutually opposite direction which is the direction crossing the extension direction of the pair of resonating arms 22 from the base portion 21, and is bent at approximately a right angle in a bent portion 32 and then extends in parallel to the extension direction of the pair of resonating arms 22. By bending the supporting arm 30 in such a manner, it is possible to miniaturize the resonating arm 20 having the supporting arm 30. The supporting arm 30 includes a fixing region which is disposed closer to the tip end side (the side of the resonating arm 22 close to the weight portion 29) than the bent portion 32 and which is attached to a package or the like described later. Since the resonator element 20 is attached so as to be supported by the fixing region of the supporting arm 30, the resonating arm 22 and the base portion 21 can be floated from the fixed surface of the resonator element 20.

On the surface of each resonating arm 22 including the respective elongated grooves 26a and 26b and the two side surfaces thereof, excitation electrodes 33 and 34 are formed (see FIG. 1B). When a voltage is applied between the excitation electrodes 33 and 34 in one resonating arm 22, the two side surfaces of the resonating arm 22 are expanded and contracted, whereby the resonating arm 22 vibrates. The excitation electrodes 33 and 34 can be formed by etching a quartz crystal to form an outer shape including the elongated grooves 26a and 26b of the resonator element 20, forming an electrode layer, for example, made from gold (Au) by deposition or sputtering on a base layer, for example, made from nickel (Ni) or chromium (Cr), and patterning a resulting structure using photolithography. Here, it has been understood that chromium has high adhesion to quartz crystals and gold has a low electrical resistance and is not easily oxidized.

Here, the effect of the resonator element 20 of this embodiment will be described.

First, the present inventor performed a simulation to obtain the occupancy where low frequency is efficiently achieved and the occupancy where the decrease of the Q value calculated at a constant frequency is efficiently suppressed while changing the occupancy of the length l of the weight portion 29 with respect to the length L from the root of the resonating arm 22 attached to the base portion 21 to the tip end. According to the simulation results, the occupancy where low frequency is efficiently achieved was not identical to the occupancy where the decrease of the Q value is efficiently suppressed.

Subsequently, an element that improves the efficiency of achieving the low frequency of the resonator element 20 and an element that further decreases the thermoelastic loss were multiplied with the occupancy of the length of the weight portion 29 with respect to the length from the root of the resonating arm 22 attached to the base portion 21 to the tip end. In addition, the multiplication result was corrected so as to match the optimum value obtained through a simulation based on an equivalent model. In this way, the results shown in the graph of FIG. 2 was obtained.

Figure 2:
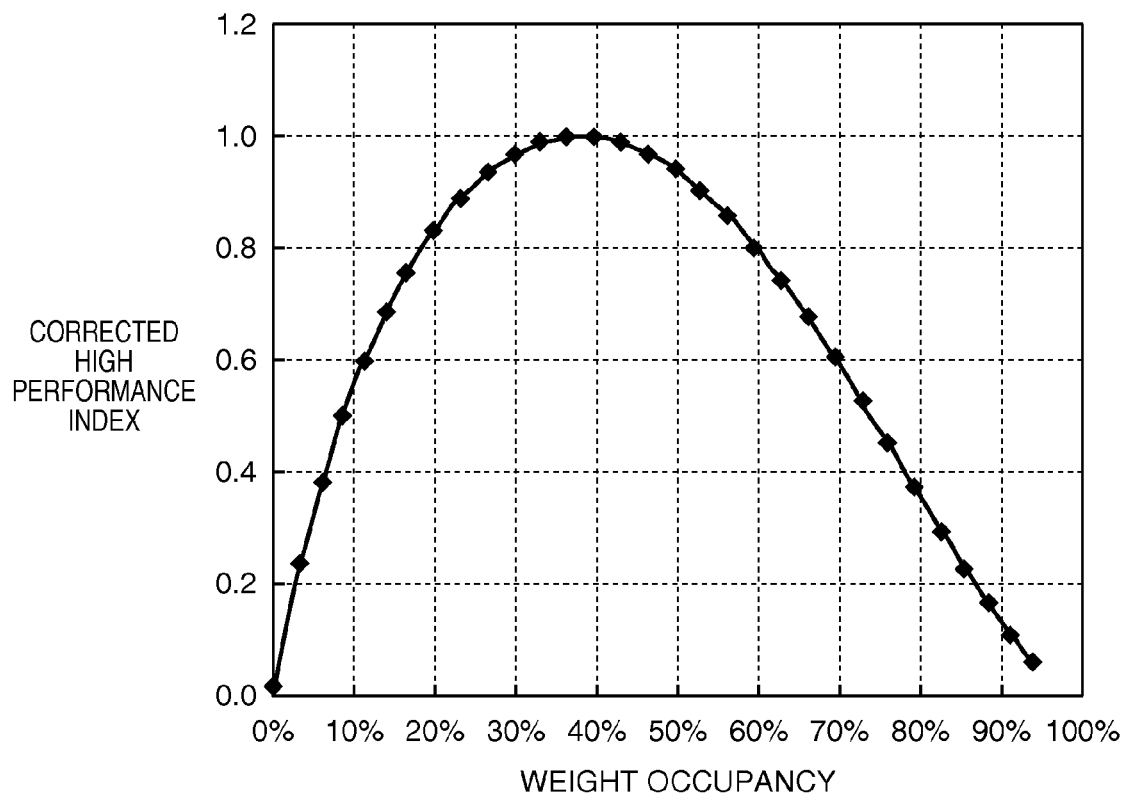
FIG. 2 is a graph showing the relationship between the occupancy of a weight portion of the resonator element and a high performance index.

In FIG. 2, the horizontal axis represents the weight occupancy (%) of the length l of the weight portion 29 with respect to the length L in the longitudinal direction from the root of the resonating arm 22 attached to the base portion 21 to the tip end, and the vertical axis represents a corrected high performance index which defines a multiplication of a low-frequency index and a high-Q index.

As shown in the graph of FIG. 2, the present inventor has found that the corrected high performance index reaches the highest in the range of weight occupancies of 35% to 41% around the center weight occupancy of 38%.

The low-frequency index is a value which indicates the amount of decrease in the frequency by the weight portion and which is normalized to a value of 0 to 1. Specifically, the low-frequency index is a value which is normalized to 1 for the lowest Q value and 0 for the highest Q value when the weight occupancy was changed between 0% and 100%.

Moreover, the high-Q index is a value which indicates the amount of increase in the Q value by the weight portion and which is normalized to a value of 0 to 1. Specifically, the high-Q index is a value which is normalized to 1 for the highest Q value and 0 for the lowest Q value when the weight occupancy was changed between 0% and 100%.

Therefore, according to the resonator element 20 of the above-described embodiment, the elongated grooves 26a and 26b provided to each resonating arm 22 improve the vibration efficiency and decrease the CI value. Moreover, since the length l in the longitudinal direction of the weight portion 29 formed in the tip end of each resonating arm 22 occupies 35% to 41% of the entire length L of the resonating arm 22, the frequency can be suppressed to a sufficiently low value without increasing the length of the resonating arm 22. Furthermore, an effect of decreasing the thermoelastic loss and sufficiently suppressing the decrease of the Q value is obtained.

The present inventor has found that this effect is noticeable when the weight occupancy of the weight portion 29 of each resonating arm 22 is within the range of 36% to 40%.

The present inventor has also found that this effect is more noticeable when the weight occupancy of the weight portion 29 of each resonating arm 22 is within the range of 37% to 39%.

Vibrator

Next, a resonator using the above-described resonator element 20 will be described.

Figure 3A:
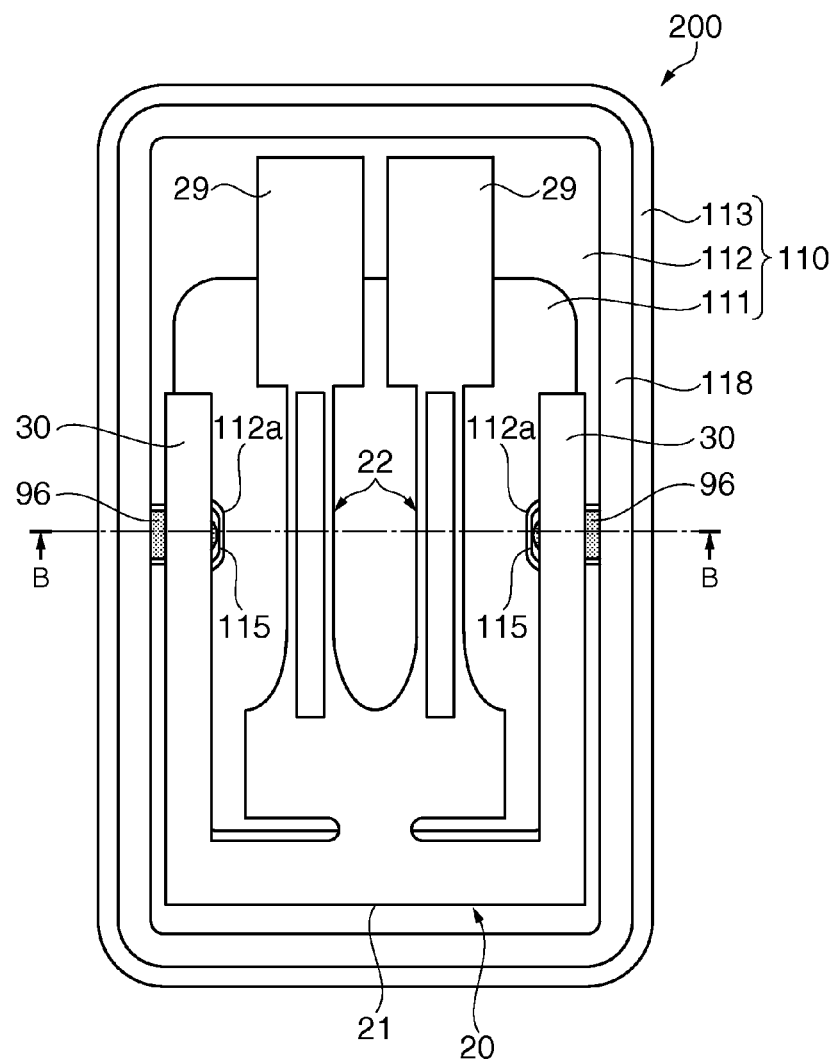
FIG. 3A is a schematic top view illustrating an embodiment of a resonator having the resonator element as seen from above.
Figure 3B:
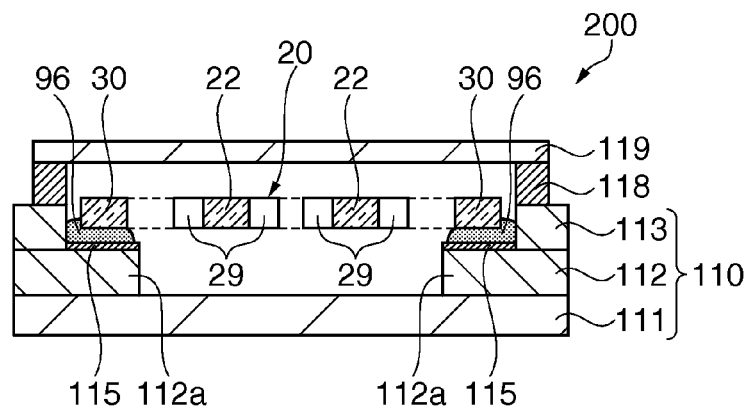
FIG. 3B is a cross-sectional view taken along the line B-B in FIG. 3A.

FIGS. 3A and 3B illustrate an embodiment of a resonator mounting the above-described resonator element 20, in which FIG. 3A is a schematic top view as seen from above, and FIG. 3B is a cross-sectional view taken along the line B-B in FIG. 3A. In FIG. 3A, for better understanding of the inner structure of the resonator, a state where a lid 119 (see FIG. 3B) provided above a resonator 200 is removed is shown.

In FIGS. 3A and 3B, the resonator 200 has a package 110 in which a stepped recess is provided. The resonator element 20 is bonded to a bottom portion of the recess of the package 110, and a lid 119 as a cover is bonded to an open upper end of the package 110.

The package 110 has a structure in which rectangular ring-shaped second and third-layer substrates 112 and 113 having different sized inner ring-shaped portions are sequentially formed on a planar first-layer substrate 111. Thus, the package 110 has a recess which has an opening on the upper surface side and has a step at the inner side. As for a material of the package 110, ceramics, glass, and the like can be used, for example.

In the recess of the package 110, a plurality of resonator element connection terminals 115 which is bonded to the resonator element 20 is provided on a step that is formed by the second-layer substrate 112. Moreover, although not shown in the drawing, external mounting terminals used for achieving bonding to an external substrate are provided on an outer bottom surface of the first-layer substrate 111 which is the outer bottom surface of the package 110.

The above-described respective terminals provided to the package 110 are connected to the corresponding terminals by in-layer wirings such as, for example, lead-out wirings and through-holes which are not shown.

In the recess of the package 110, the resonator element 20 is bonded. Specifically, external connection electrodes (not shown) provided in a part of the supporting arm 30 of the resonator element 20 and the resonator element connection terminals 115 provided on the step of the recess of the package 110 and formed by the projections 112a of the second-layer substrate 112 are aligned with respect to each other and are bonded by a conductive bonding material 96 such as, for example, a silver paste, and electrically connected to each other. In this way, the resonator element 20 is fixed to the recess of the package 110 with the resonating arm 22 remaining as a free end while leaving a gap between the resonator element 20 and the first-layer substrate 111 which is the bottom portion of the recess.

As shown in FIG. 3B, the lid 119 as a cover is disposed on the upper end of the package 110 in which the resonator element 20 is bonded in the recess, and the opening of the package 110 is blocked. As for a material of the lid 119, a metal such as a 42-alloy (a nickel-iron alloy containing 42% of nickel) or a kovar (an iron-nickel-cobalt alloy), ceramics or glass, and the like can be used, for example. The lid 119 made from a metal is bonded to the package 110 by shim-welding using a sealing ring 118 which is formed by punching out a kovar alloy or the like into a rectangular ring shape. An inner space formed in the package 110 is a space for allowing the resonator element 20 to operate. Moreover, the inner space is hermetically sealed with a depressurized atmosphere or an inert gas atmosphere.

According to the resonator 200 having the above-described configuration, since it includes the resonator element 20 having the above-described configuration, it is possible to provide the resonator 200 which has favorable vibration characteristics and in which the elongated grooves 26a and 26b provided to the resonating arm 22 improve the vibration efficiency and decrease the CI value, and the weight portion 29 decreases the frequency and increase the Q value.

Oscillator

Next, an oscillator using the above-described resonator element 20 will be described.

Figure 4A:
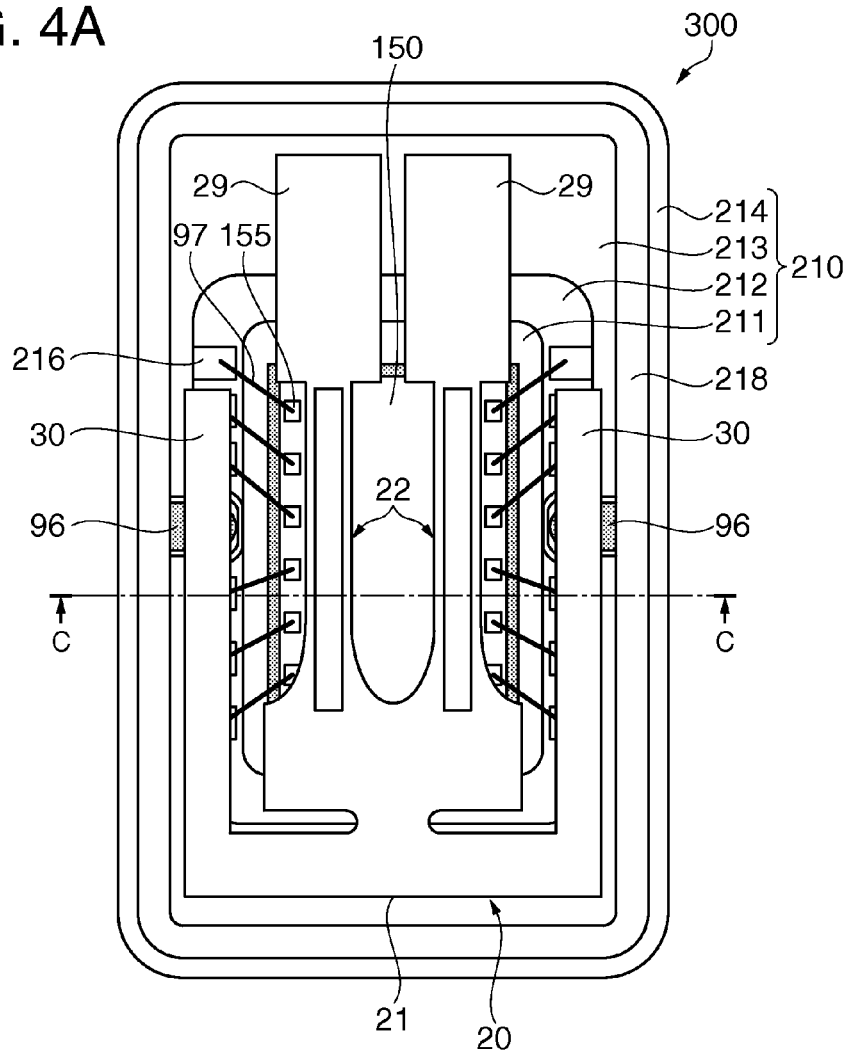
FIG. 4A is a schematic top view illustrating an embodiment of an oscillator having the resonator element as seen from above.
Figure 4B:
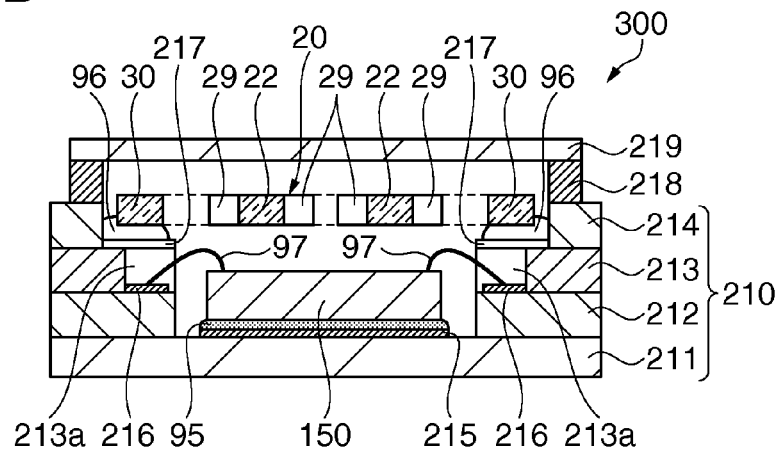
FIG. 4B is a cross-sectional view taken along the line C-C in FIG. 4A.

FIGS. 4A and 4B illustrate an embodiment of an oscillator mounting the above-described resonator element 20, in which FIG. 4A is a schematic top view as seen from above, and FIG. 4B is a cross-sectional view taken along the line C-C in FIG. 4A. In FIG. 4A, for better understanding of the inner structure of the oscillator, a state where a lid 219 provided above an oscillator 300 is removed is shown.

In FIGS. 4A and 4B, the oscillator 300 has a package 210 in which a stepped recess is provided. An IC chip 150 and the resonator element 20 disposed above the IC chip 150 are bonded to a bottom portion of the recess of the package 210, and a lid 219 as a cover is bonded to an open upper end of the package 210.

The package 210 has a structure in which rectangular ring-shaped second, third, and fourth-layer substrates 212, 213, and 214 having different sized inner ring-shaped portions are sequentially formed on a planar first-layer substrate 211. Thus, the package 210 has a recess which has an opening on the upper surface side and has a step at the inner side. As for a material of the package 210, ceramics, glass, and the like can be used, for example.

A die pad 215 on which the IC chip 150 is disposed is provided on the first-layer substrate 211 which is the bottom portion of the recess of the package 210. Although not shown in the drawing, external mounting terminals used for achieving bonding to an external substrate are provided on an outer bottom surface (a surface different from the surface on which the die pad 215 is provided) of the first-layer substrate 211 which is the outer bottom surface of the package 210.

Moreover, in the recess of the package 210, a plurality of IC connection terminals 216 which is used for achieving electrical connection to the IC chip 150 is provided on a step that is formed by the second-layer substrate 212.

Furthermore, in the recess of the package 210, a plurality of resonator element connection terminals 217, to which the resonator element 20 is bonded, is provided on a step that is formed by the third-layer substrate 213.

The above-described respective terminals provided to the package 210 are connected to the corresponding terminals by in-layer wirings such as, for example, lead-out wirings and through-holes which are not shown.

The IC chip 150 is a semiconductor circuit element (circuit portion) which includes an oscillation circuit that vibrates the resonator element 20, a temperature compensating circuit, and the like. The IC chip 150 is attached and fixed, for example, by a lead material 95, onto the die pad 215 which is provided on the bottom portion of the recess of the package 210. In this embodiment, the IC chip 150 is electrically connected to the package 210 using a wire bonding method. Specifically, a plurality of electrode pads 155 provided on the IC chip 150 is connected to the corresponding IC connection terminals 216 of the package 210 by bonding wires 97.

In the recess of the package 210, the resonator element 20 is bonded on the upper side of the IC chip 150. Specifically, external connection electrodes (not shown) provided in a part of the supporting arm 30 of the resonator element 20 and the resonator element connection terminals 217 provided on the step that is formed by a projection 213a of the third-layer substrate 213 in the recess of the package 210 are aligned with respect to each other and are bonded by a conductive bonding material 96 such as, for example, a silver paste, and electrically connected to each other. In this way, the resonator element 20 is fixed to the recess of the package 210 with the resonating arm 22 remaining as a free end while leaving a gap between the resonator element 20 and the IC chip 150 which is bonded on the lower side.

As shown in FIG. 4B, the lid 219 is disposed on the upper end of the package 210 in which the IC chip 150 and the resonator element 20 are bonded in the recess, and the opening of the package 210 is blocked. When the lid 219 is made from a metal, the lid 219 is bonded to the package 210 by shim-welding using a sealing ring 218 which is formed by punching out a kovar alloy or the like into a rectangular ring shape. An inner space which is formed in the package 210 so as to allow the resonator element 20 to operate is hermetically sealed with a depressurized atmosphere or an inert gas atmosphere.

According to the oscillator 300 having the above-described configuration, since it includes the resonator element 20 having the above-described configuration, it is possible to provide the oscillator 300 which has favorable oscillation characteristics and in which the elongated grooves 26a and 26b provided to the resonating arm 22 improve the vibration efficiency and decrease the CI value, and the weight portion 29 decreases the frequency and increase the Q value.

Electronic Device

Figure 5:
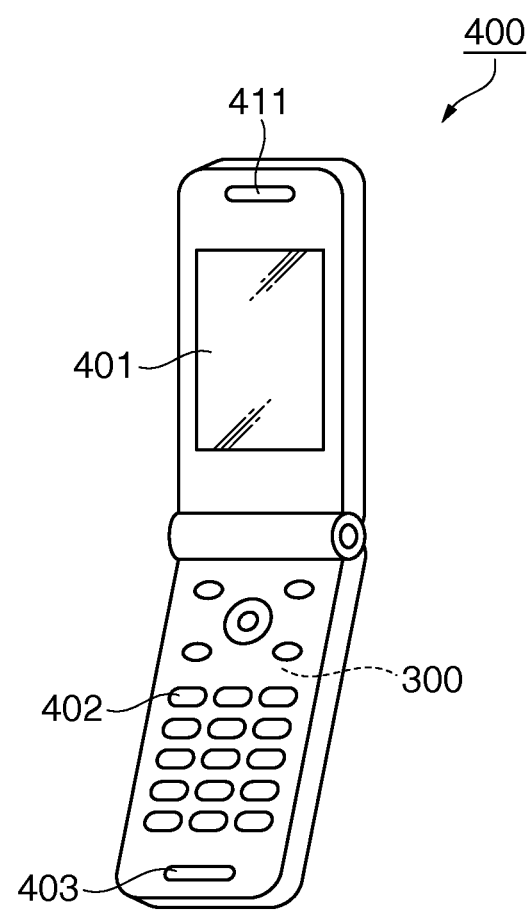
FIG. 5 is a perspective view showing a simplified configuration of a portable phone as an example of an electronic device.
Figure 6:
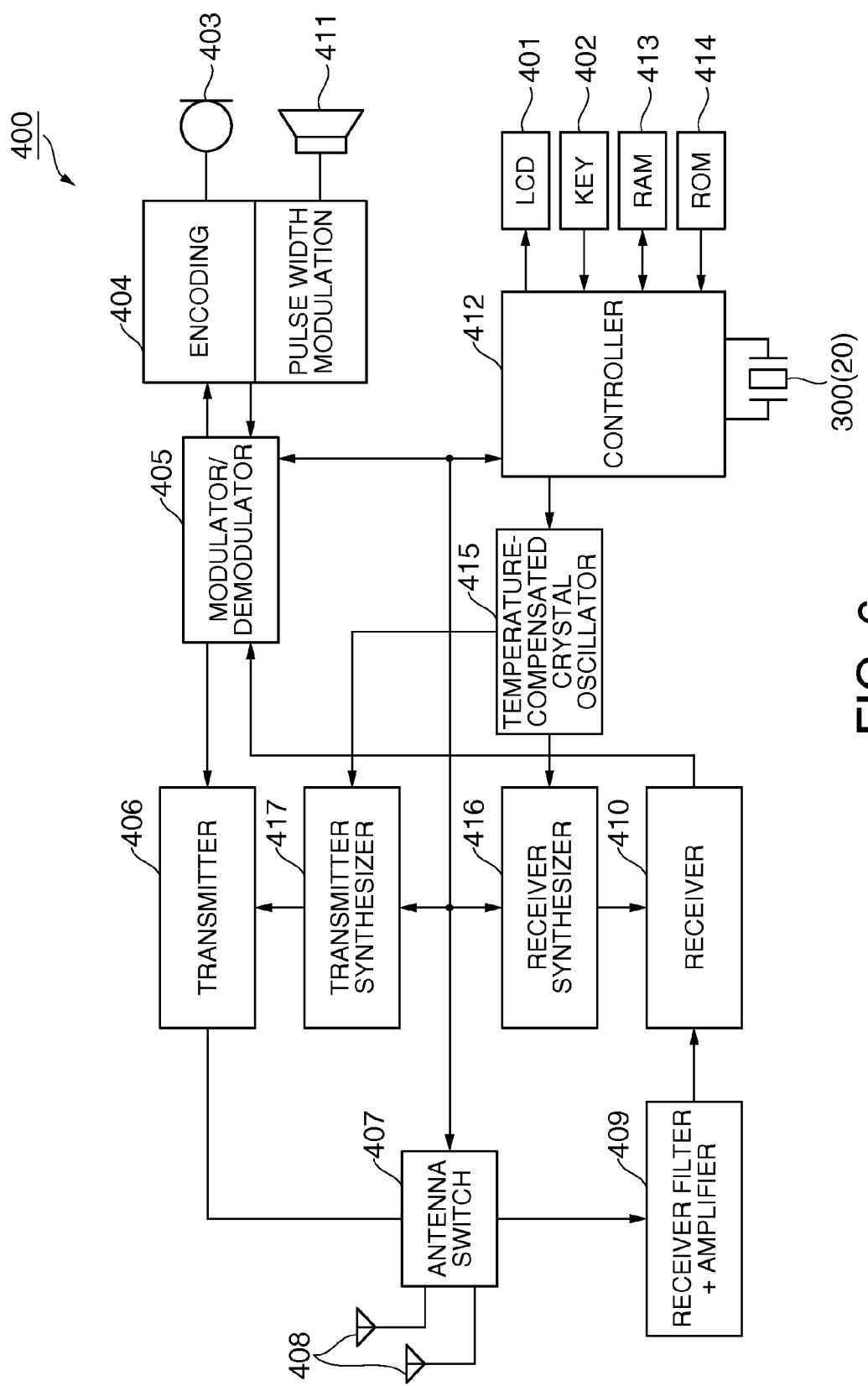
FIG. 6 is a circuit block diagram of the portable phone.

The oscillator 300 having the resonator element 20 of the above-described embodiment can be applied to various electronic devices, and such electronic devices have high reliability. FIGS. 5 and 6 show a portable phone as an example of an electronic device according to the invention. FIG. 5 is a perspective view showing a simplified external appearance of the portable phone, and FIG. 6 is a circuit block diagram illustrating the circuit portion of the portable phone. In this example, an example where an portable phone 400 includes the oscillator 300 using the resonator element 20 (FIGS. 1A and 1B) will be described. Moreover, further description of the configuration and action of the oscillator 300 will be omitted by using the same reference numerals as used in the above-described embodiment.

As shown in FIG. 5, the portable phone 400 includes an LCD (Liquid Crystal Display) 401 which is a display section, a key 402 which is an input section for inputting numbers or the like, a microphone 403, a speaker 411, and the like. As shown in FIG. 6, when a user inputs his/her voice into the microphone 403 to perform communication using the portable phone 400, the voice signals are transmitted from an antenna 408 through a pulse-width modulation/encoding block 404, a modulator/demodulator block 405, a transmitter 406, and an antenna switch 407.

On the other hand, signals transmitted from a counterpart phone are received by the antenna 408 and input to the modulator/demodulator block 405 through the antenna switch 407, a receiver filter 409, and a receiver 410. Moreover, the modulated or demodulated signals are output to the speaker 411 as a sound through the pulse-width modulation/encoding block 404. A controller 412 is provided so as to control the antenna switch 407, the modulator/demodulator block 405, and the like.

In addition to the above-mentioned components, the controller 412 controls the LCD 401 which is a display section and the key 402 which is an input section for inputting numbers or the like, and further controls a RAM 413, a ROM 414, and the like. Thus, higher precision is demanded. Moreover, there is also a demand for miniaturization of the portable phone 400. To meet such a demand, the above-described resonator element 20 is used. The portable phone 400 also includes a temperature-compensated quartz crystal oscillator 415, a receiver synthesizer 416, a transmitter synthesizer 417, and the like as its constituent blocks, and description thereof is omitted.

Figure 7:
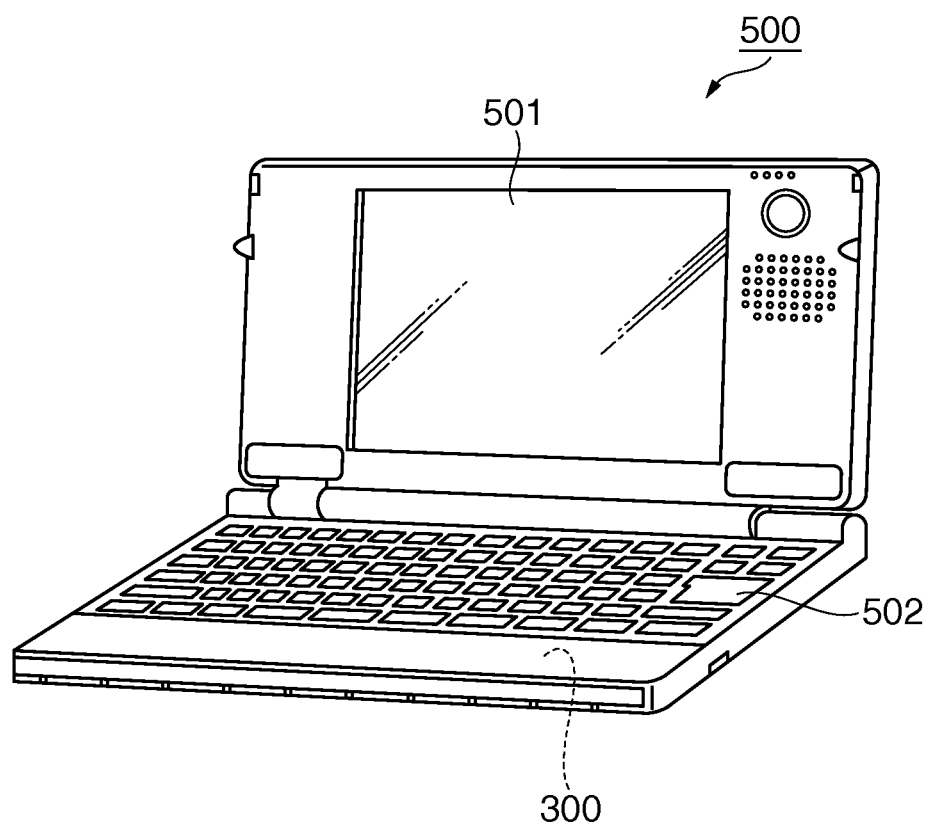
FIG. 7 is a perspective view showing a simplified configuration of a personal computer as an example of an electronic device.

FIG. 7 shows a personal computer (mobile personal computer) 500 as another example of the electronic device having the oscillator 300 using the resonator element 20 according to the invention. The personal computer 500 includes a display section 501, an input key section 502, and the like, and the resonator element 20 described above is used as a reference clock for controlling the electrical operation thereof.

Since the oscillator 300 used in the portable phone 400 and the personal computer 500 has the resonator element 20 in which the proportion of the length l of the weight portion 29 to the length L from the root of the resonating arm 22 attached to the base portion 21 to the tip end is set so as to be within the range of 35% to 41%, the oscillator 300 has favorable vibration characteristic and has an effect of suppressing the frequency to a sufficiently low value without increasing the length of the resonating arm 22 and an effect of decreasing the thermoelastic loss and sufficiently suppressing the decrease of the Q value. Therefore, the portable phone 400 and the personal computer 500 can be miniaturized and has high reliability.

In addition to the above-mentioned examples, examples of the electronic device having the oscillator 300 according to the invention include digital-still cameras, ink jet ejection apparatuses (for example, ink jet printers), laptop personal computers, televisions, video cameras, video tape recorders, car navigation apparatuses, pagers, electronic pocket books (including ones with communication capabilities), electronic dictionaries, calculators, electronic gaming machines, word processors, work stations, television phones, surveillance TV monitors, electronic binoculars, POS terminals, medical devices (for example, electronic thermometers, sphygmomanometers, glucose meters, electrocardiogram measuring systems, ultrasonic diagnosis devices, and electronic endoscopes), fish finders, various measurement instruments, various indicators (for example, indicators used in vehicles, airplanes, and ships), flight simulators, and the like.

While the electronic device according to the invention has been described based on the embodiment illustrated in the drawings, the invention is not limited to the embodiments, and the configuration of the respective portions, units, and sections can be replaced with any configuration having the same function. Moreover, other arbitrary constituent elements may be added to the invention. For example, although in the embodiment described above, a case where the resonator element 20 has a pair of resonating arms 22 as the vibrating portions was described, the number of resonating arms 22 may be three or more. In addition, the resonator element 20 may be a beam-type resonator element which has only one resonating arm having a base portion serving as a fixed end.

Moreover, the resonator element 22 described in the embodiment may be applied to a gyro sensor or the like, in addition to a oscillator such as a voltage-controlled crystal oscillator (VCXO), a temperature-compensated crystal oscillator (TCXO), or an oven-controlled crystal oscillator (OCXO).

The invention can be modified in various ways within a range without departing from the spirit thereof. For example, in the embodiment described above, the effect of setting the optimum proportion of the length of the weight portion 29 to provide favorable vibration characteristics, which is the feature of the invention, has been described by way of the resonator element 20 that vibrates in the flexural vibration mode of the oscillator 300 provided in an electronic device. However, the invention is not limited to this, and by providing the feature of the invention to a resonator element having other vibration modes other than the flexural vibration mode such as a torsional vibration mode or a shear vibration mode, the same effect as obtained in the embodiment described above can be obtained.

In the embodiment described above, an embodiment of the invention has been described with respect to the so-called tuning-fork type resonator element 20 which has the supporting arm 30 for a supporting purpose only extended from the base portion 21 and in which two resonating arms 22 are extended in parallel from the base portion 21. However, the invention is not limited to this, and the same effect obtained in the embodiment described above can be obtained in a resonator element without the supporting arm 30.

In the embodiment described above, the resonator element 20 made from a piezoelectric material, particularly, a quartz crystal resonator element made from a quartz crystal, has been described. However, the invention is not limited to this, and the same effect obtained in the embodiment described above can be obtained in a resonator element made from silicon or the like that is a non-piezoelectric material.

The entire disclosure of Japanese Patent Application Nos: 2010-060325, filed Mar. 17, 2010 and 2010-281336, filed Dec. 17, 2010 are expressly incorporated by reference herein.

What is claimed is:

1. A resonator element comprising:
    a base portion;
    a resonating arm that is extended from the base portion, in a first direction, the resonating arm having a first surface and a second surface opposite to the first surface;
    an elongated groove that is formed in the first surface of the resonating arm and that is extended in the first direction, wherein
    the resonating arm comprises:
        a weight portion;
        an arm portion that extends from the weight portion, a width of the arm portion in a second direction perpendicular to the first direction is smaller than a width of the weight portion in the second direction; and
        an arm root portion that is located between the arm portion and the base portion, a width of the arm root portion in the second direction gradually increasing toward the base portion,
    the first surface of the resonating arm is coplanar along an entirety of the weight portion, the arm portion and the arm root portion, and a percentage of a length of the weight portion in the first direction to a length of the resonating arm in the first direction is equal to or more than 35% and equal to or less than 41%.

2. The resonator element according to claim 1, wherein the percentage is equal to or more than 36% and equal to or less than 40%.

3. The resonator element according to claim 2, wherein the percentage is equal to or more than 37% and equal to or less than 39%.

4. The resonator element according to claim 1, wherein the base portion and the resonating arm are formed from a quartz crystal.

5. The resonator element according to claim 1, wherein the resonating arm vibrates in a flexural vibration mode.

6. A resonator comprising:
the resonator element according to claim 1; and
a package that includes the resonator element.

7. An oscillator comprising:
the resonator element according to claim 1; and
a circuit portion that is electrically connected to the resonator element.

8. An electronic device comprising the resonator element according to claim 1.

9. The resonator element according to claim 1, wherein the resonating arm is configured with a pair of arms.

10. The resonator element according to claim 9, further comprising:
a supporting arm that is extended from the base portion in the first direction between the pair of arms.

11. The resonator element according to claim 9, further comprising:
a pair of supporting arms that are extended from the base portion in the first direction and that are located outside the pair of arms.

12. The resonator element according to claim 1, wherein the base portion comprises:
a first portion from which the resonating arm is extended, the first portion having a first portion width in the second direction;
a second portion that is located opposite to the resonating arm and that is provided next to the first portion, the second portion having a second portion width in the second direction; and
a connecting portion that connects the first and second portions, the connecting portion having a connecting portion width in the second direction that is smaller than the first and second portion widths, and
a pair of notches are provided at sides of the connecting portion between the first and second portions.

* * * * *